US012696458B2

(12) United States Patent
Xiao et al.

(10) Patent No.: US 12,696,458 B2
(45) Date of Patent: Jul. 28, 2026

(54) SEMICONDUCTOR STRUCTURE AND MANUFACTURING METHOD THEREOF

(71) Applicant: CHANGXIN MEMORY TECHNOLOGIES, INC., Hefei City (CN)

(72) Inventors: Deyuan Xiao, Hefei City (CN); Kanyu Cao, Hefei City (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 974 days.

(21) Appl. No.: 17/936,096

(22) Filed: Sep. 28, 2022

(65) Prior Publication Data

US 2023/0292530 A1    Sep. 14, 2023

Related U.S. Application Data

(63) Continuation of application No. PCT/CN2022/110753, filed on Aug. 8, 2022.

(30) Foreign Application Priority Data

Mar. 10, 2022    (CN) .......................... 202210235558.2

(51) Int. Cl.
 *H10B 61/00* (2023.01)
 *H10N 50/01* (2023.01)
 *H10N 50/80* (2023.01)
(52) U.S. Cl.
 CPC .............. *H10B 61/22* (2023.02); *H10N 50/01* (2023.02); *H10N 50/80* (2023.02)
(58) Field of Classification Search
 CPC ......... H10B 61/22; H10N 50/01; H10N 50/80
 See application file for complete search history.

(56) References Cited

U.S. PATENT DOCUMENTS

| | | | |
|---|---|---|---|
| 11,127,783 B2 | 9/2021 | Zhu et al. | |
| 2015/0214314 A1* | 7/2015 | Oh ....................... | H10D 64/021 |
| | | | 257/330 |

(Continued)

FOREIGN PATENT DOCUMENTS

| | | |
|---|---|---|
| CN | 1809914 A | 7/2006 |
| CN | 109461756 A | 3/2019 |

(Continued)

OTHER PUBLICATIONS

Sanchez, Silicide Formation by High Does Transition Metal Implants Into Si, 2011 (Year: 2011).*

(Continued)

*Primary Examiner* — Britt Hanley
*Assistant Examiner* — Casey Paul Boatman
(74) *Attorney, Agent, or Firm* — Intellectual Valley Law, P.C.

(57) ABSTRACT

The present disclosure provides a semiconductor structure and a manufacturing method thereof. The method of manufacturing the semiconductor structure provided by the present disclosure includes: providing a substrate; forming a base pattern on the substrate, where the base pattern includes a plurality of bit lines arranged in parallel, and an isolation structure is disposed between adjacent two of the bit lines; forming a plurality of semiconductor pillars arranged in a direction of the bit line on a surface of each of the bit lines, where the bit line is electrically connected to the semiconductor pillar; forming a gate-all-around structure on a surface of the semiconductor pillar, where the gate-all-around structure includes a first insulating layer, a gate structure layer, and a second insulating layer that are sequentially disposed on a side surface of the semiconductor pillar.

12 Claims, 7 Drawing Sheets

(56)          References Cited

U.S. PATENT DOCUMENTS

2019/0157345 A1 *   5/2019   Zhu ........................ H10B 61/00
2023/0135098 A1 *   5/2023   Lin ...................... H10N 70/061
2023/0369426 A1 *   11/2023  Sharma ............. H10D 30/6729

FOREIGN PATENT DOCUMENTS

| | | |
|---|---|---|
| CN | 111816671 A | 10/2020 |
| CN | 112863566 A | 5/2021 |
| CN | 114709168 A | 7/2022 |

OTHER PUBLICATIONS

International Search Report cited in PCT/CN2022/110753 mailed Oct. 27, 2022, 9 pages.

* cited by examiner

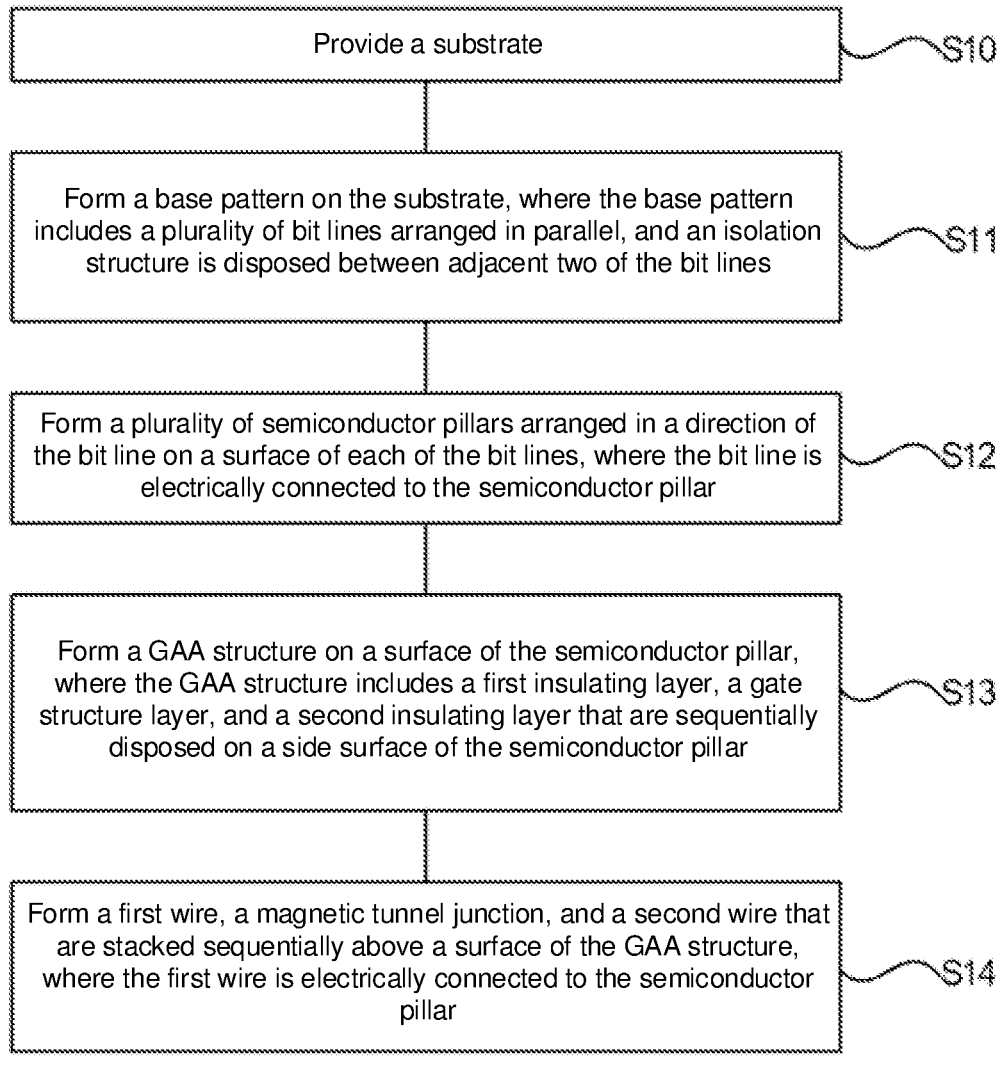

| Provide a substrate | S10 |

| Form a base pattern on the substrate, where the base pattern includes a plurality of bit lines arranged in parallel, and an isolation structure is disposed between adjacent two of the bit lines | S11 |

| Form a plurality of semiconductor pillars arranged in a direction of the bit line on a surface of each of the bit lines, where the bit line is electrically connected to the semiconductor pillar | S12 |

| Form a GAA structure on a surface of the semiconductor pillar, where the GAA structure includes a first insulating layer, a gate structure layer, and a second insulating layer that are sequentially disposed on a side surface of the semiconductor pillar | S13 |

| Form a first wire, a magnetic tunnel junction, and a second wire that are stacked sequentially above a surface of the GAA structure, where the first wire is electrically connected to the semiconductor pillar | S14 |

FIG. 1

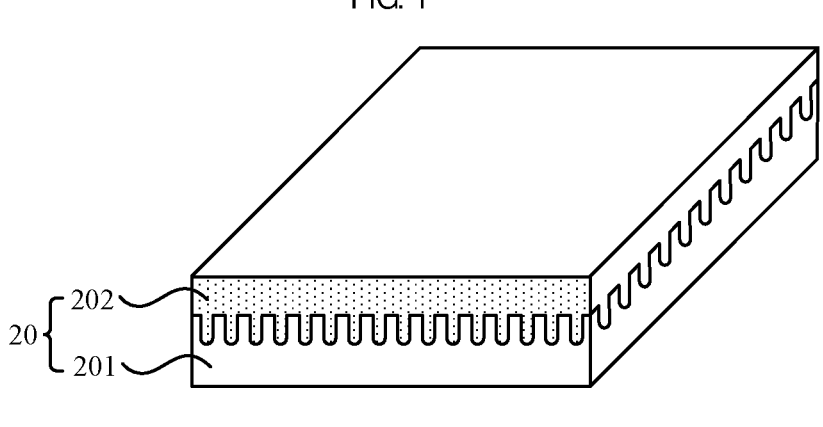

FIG. 2A

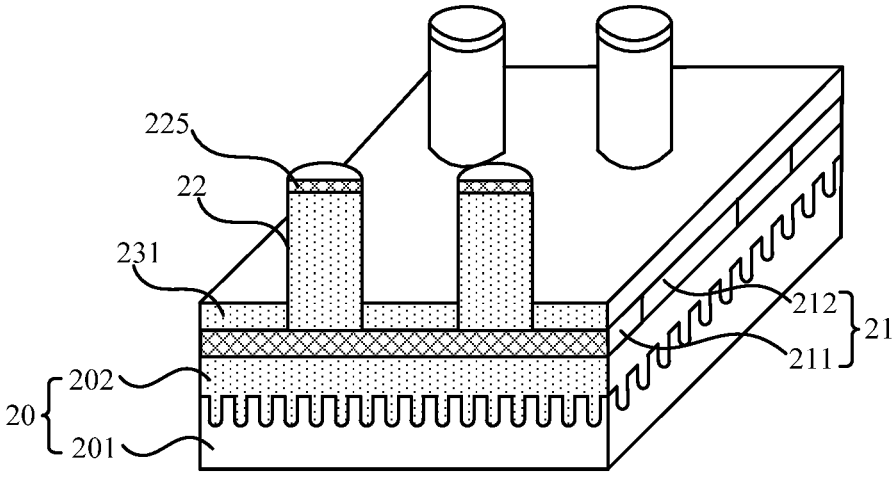
FIG. 5A
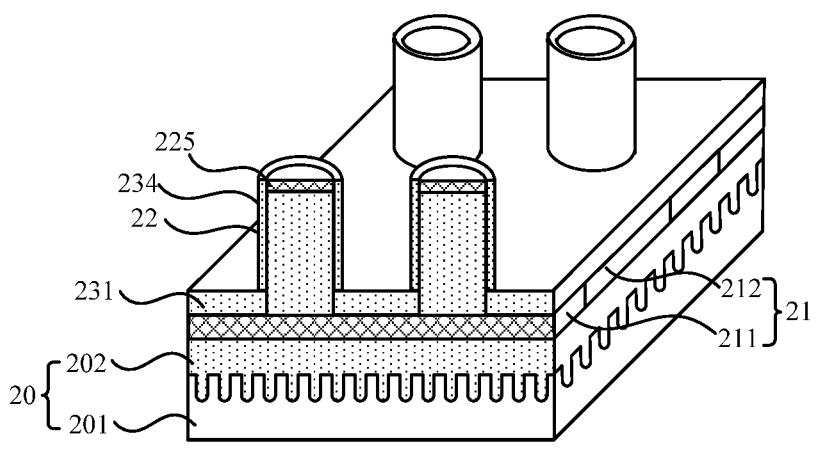
FIG. 5B
FIG. 5C

SEMICONDUCTOR STRUCTURE AND MANUFACTURING METHOD THEREOF

CROSS-REFERENCE TO RELATED APPLICATIONS

This is a continuation of International Application No. PCT/CN2022/110753, filed on Aug. 8, 2022, which claims the priority to Chinese Patent Application No. 202210235558.2, titled "SEMICONDUCTOR STRUC- TURE AND MANUFACTURING METHOD THEREOF" and filed with the China National Intellectual Property Administration (CNIPA) on Mar. 10, 2022. The entire con- tents of International Application No. PCT/CN2022/110753 and Chinese Patent Application No. 202210235558.2 are incorporated herein by reference.

TECHNICAL FIELD

The present disclosure relates to the technical field of semiconductors, and in particular to a semiconductor struc- ture and a manufacturing method thereof.

BACKGROUND

The demand for cheaper semiconductor structures with high performance boosts a larger integration density, which in turn imposes higher requirements on the manufacturing process of the semiconductors.

The integration density of a two-dimensional (2D) or planar semiconductor structure is determined partially by the areas occupied by the individual elements (for example, memory cells) that make up the integrated circuit. The areas occupied by the individual elements are mainly determined by the dimensional parameters (for example, widths, lengths, pitches, narrowness, and adjacent spacings) used to define the patterning technique for the individual elements and their interconnections. Quite expensive patterning equipment needs to be developed and used to provide increasingly "fine" patterns.

As the semiconductor industry moves into nanotechnol- ogy process nodes in pursuit of higher device densities and performance as well as lower costs, challenges from fabri- cation and design issues have promoted, for example, the development of three-dimensional designs of gate-all- around field effect transistors (GAA FETs).

In GAA FETs, all sides of the channel region are sur- rounded by the gate electrodes, which allows more adequate depletion in the channel region. In addition, fewer short- channel effects are generated due to steeper sub-threshold current swing (SS) and smaller drain-induced barrier low- ering (DIBL).

As transistor sizes continue to shrink to technology nodes below 10-15 nm, semiconductor structures with GAA FETs need to be improved to meet the demand.

SUMMARY

The method of manufacturing a semiconductor structure provided by the present disclosure includes: providing a substrate; forming a base pattern on the substrate, where the base pattern includes a plurality of bit lines arranged in parallel, and an isolation structure is disposed between adjacent two of the bit lines; forming a plurality of is semiconductor pillars arranged in a direction of the bit line on a surface of each of the bit lines, where the bit line is electrically connected to the semiconductor pillar; forming a GAA structure on a surface of the semiconductor pillar, where the GAA structure includes a first insulating layer, a gate structure layer, and a second insulating layer that are sequentially disposed on a side surface of the semiconductor pillar; and forming a first wire, a magnetic tunnel junction, and a second wire that are stacked sequentially above a surface of the GAA structure, where the first wire is elec- trically connected to the semiconductor pillar.

The present disclosure further provides a semiconductor structure, including a substrate; a plurality of bit lines, disposed on a surface of the substrate and arranged in parallel; semiconductor pillars, disposed on surfaces of the bit lines and arranged along a direction of the bit line, where the semiconductor pillar is electrically connected to the bit line; a GAA structure, where the GAA structure includes a first insulating layer, a gate structure layer, and a second insulating layer that are sequentially disposed on a side surface of the semiconductor pillar; and a first wire, a magnetic tunnel junction, and a second wire that are sequen- tially disposed above a surface of the GAA structure, where the first wire is electrically connected to the semiconductor pillar.

BRIEF DESCRIPTION OF THE DRAWINGS

FIG. 1 is a schematic diagram of steps of a method of manufacturing a semiconductor structure according to a specific implementation of the present disclosure;

FIGS. 2A to 2E are schematic cross-sectional views of a process of a method of manufacturing a semiconductor structure according to a specific implementation of the present disclosure;

FIGS. 3A to 3B are schematic cross-sectional views of a process for forming a base pattern according to a specific implementation of the present disclosure;

FIGS. 4A to 4B are schematic cross-sectional views of a process for forming a semiconductor pillar according to a specific implementation of the present disclosure;

FIGS. 5A to 5E are schematic cross-sectional views of a process for forming a GAA structure according to a specific implementation of the present disclosure.

DETAILED DESCRIPTION

Figures 2B, 2C, 2D:
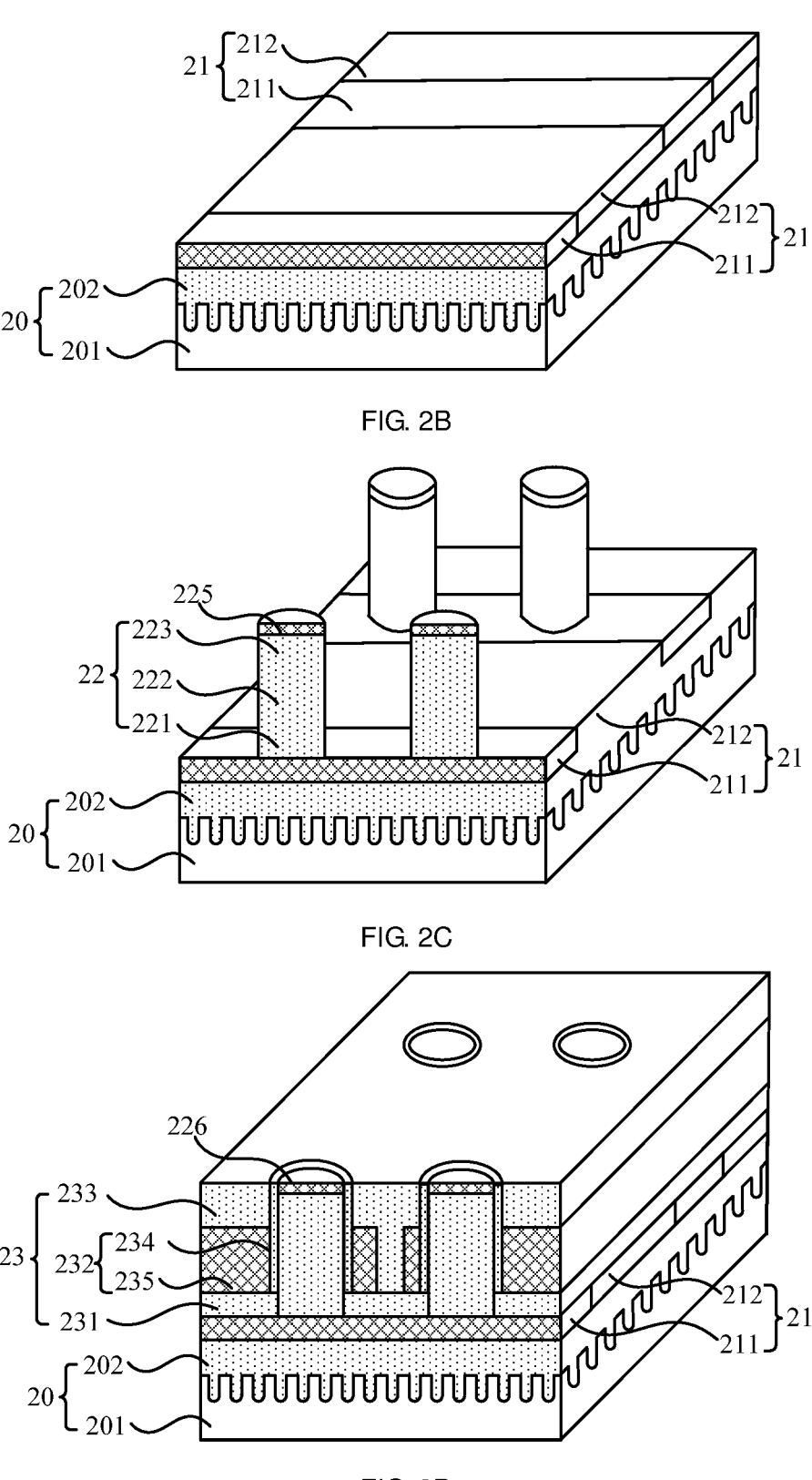

Specific implementations of a semiconductor structure and a manufacturing method thereof provided in the present disclosure are described in detail below with reference to the accompanying drawings.

FIG. 1 is a schematic diagram of steps of a method of manufacturing a semiconductor structure according to a specific implementation of the present disclosure. With reference to FIG. 1, the method of manufacturing a semi- conductor structure includes: step S10, Provide a substrate 20; step S11, Form a base pattern 21 on the substrate 20, where the base pattern 21 includes a plurality of bit lines 211 arranged in parallel, and an isolation structure 212 is dis- posed between adjacent two of the bit lines; step S12, Form a plurality of semiconductor pillars 22 arranged in a direc- tion of the bit line on a surface of each of the bit lines 211, where the bit line 211 is electrically connected to the semiconductor pillar 22; Step S13, Form a GAA structure 23 on a surface of the semiconductor pillar 22, where the GAA structure 23 includes a first insulating layer 231, a gate structure layer 232, and a second insulating layer 233 that are sequentially disposed on a side surface of the semiconductor pillar 22; and Step S14, Form a first wire 24, a magnetic tunnel junction 25, and a second wire 26 that are stacked sequentially above a surface of the GAA structure 23, where the first wire 24 is electrically connected to the semiconductor pillar 22.

FIGS. 2A to 2E are schematic cross-sectional views of a process of a method of manufacturing a semiconductor structure according to a specific implementation of the present disclosure. With reference to step S10 and FIG. 2A, the substrate 20 is provided. The substrate 20 includes a first substrate 201 and a second substrate 202. The conductivity type of the substrate 201 may be N-type or P-type. In this embodiment, the substrate 201 is a P-type single crystal silicon substrate, and is provided with a logic circuit. The second substrate 202 is provided with an injection laser diode (ILD).

With reference to step S11 and FIG. 2B, a base pattern 21 is formed on the substrate 20. The base pattern 21 includes a plurality of bit lines 211 arranged in parallel, and an isolation structure is disposed between adjacent two of the bit lines 211.

Figures 2E, 3A:
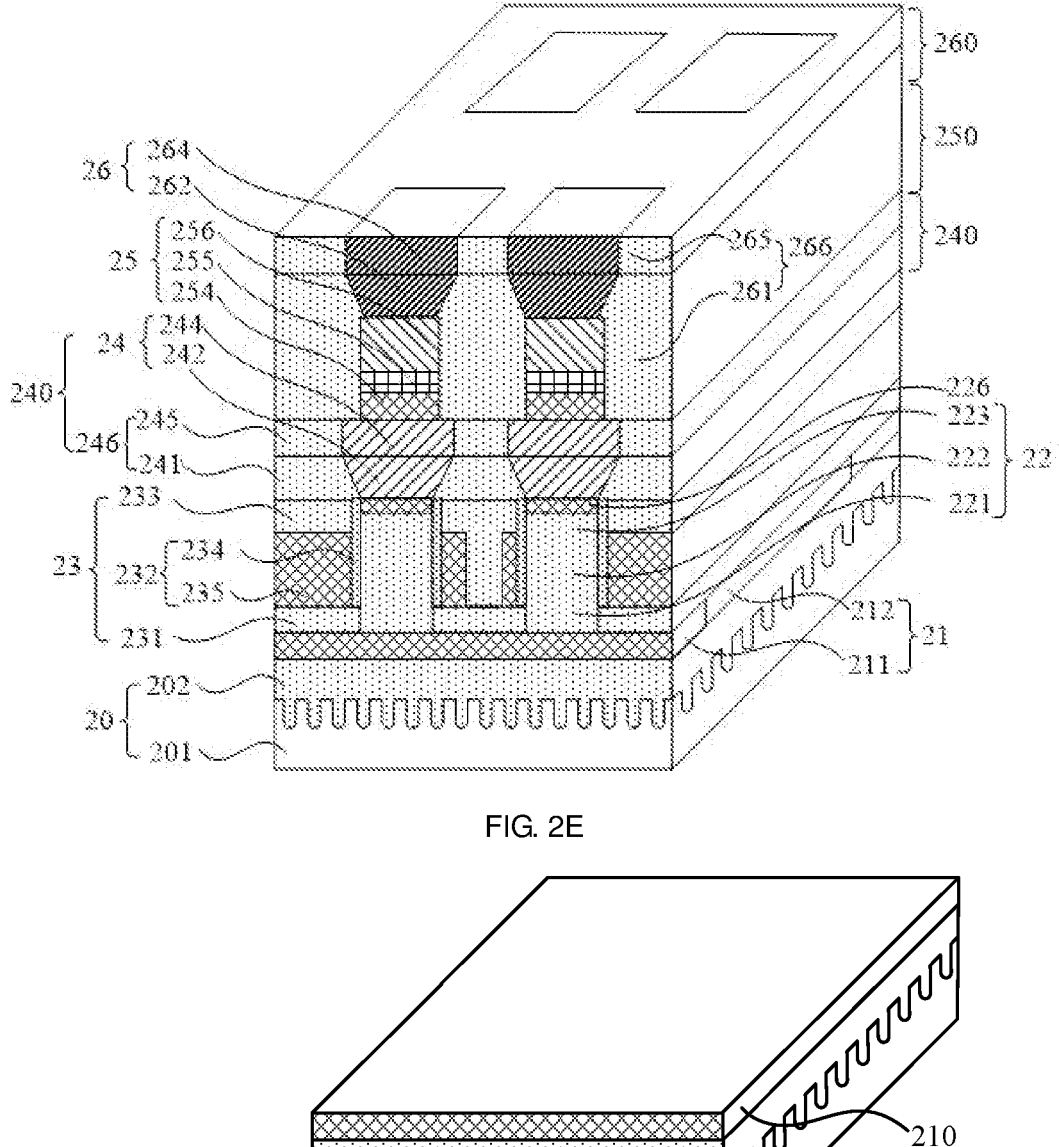
Figures 3B, 4A, 4B:
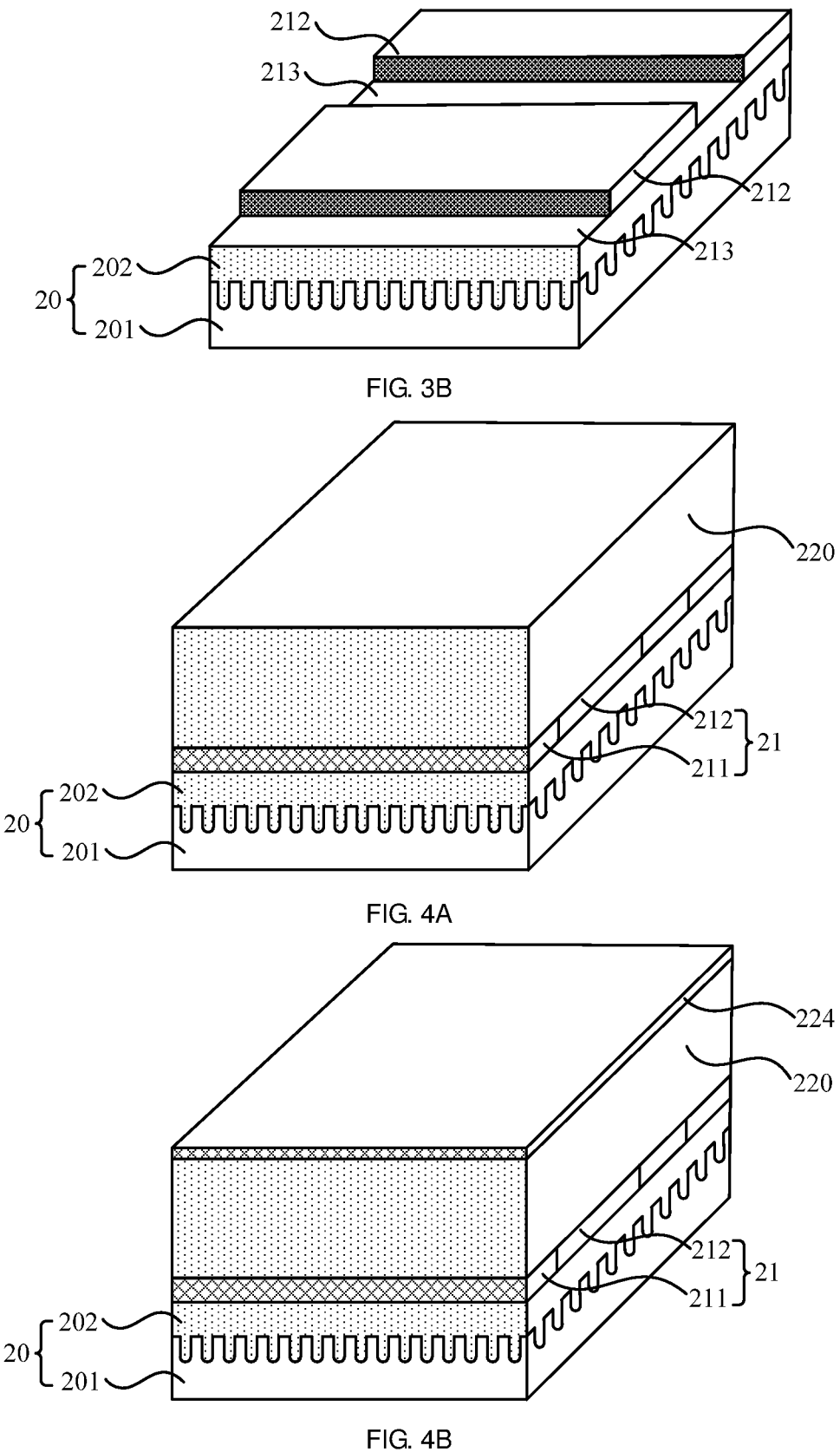

In this embodiment, a method for forming the base pattern is used as an example. FIGS. 3A to 3B are schematic cross-sectional views of a process for forming a base pattern according to a specific implementation of the present disclosure.

With reference to FIG. 3A, an isolation layer 210 is formed on a surface of the substrate 20. The isolation layer may be made of an insulating material, such as an oxide, a nitride, and the like. In this embodiment, the isolation layer is made of silicon dioxide.

With reference to FIG. 3B, the isolation layer 210 is patterned, to form an isolation structure 212 where the isolation structure 212 includes a plurality of bar grooves 213 arranged in parallel. In this step, the isolation layer 210 may be patterned by using a combination of photolithography and etching processes. The isolation structure 212 is electrically isolated from the bit line.

With reference to FIG. 2B, the bit line 211 is formed in each of the plurality of bar grooves 213. In a specific implementation of the present disclosure, a first metal silicide layer 214 (not shown in the figure) is formed on the surface of the bit line 211. The metal silicide employed may include any metal capable of forming a silicide, including but not limited to cobalt, nickel, molybdenum, titanium, tungsten, tantalum, platinum, and combinations of these materials. Metal silicide includes, but is not limited to, cobalt silicide, tantalum silicide, nickel silicide, titanium silicide, tungsten silicide, and the like. In addition, the metal silicide may further include, for example, a combination of nitrogen-doped silicide, such as a combination of cobalt silicide nitride, tungsten nitride silicide, or tungsten silicide nitride/tungsten silicide. The first metal silicide layer 214 can reduce the contact resistance between the metal and the silicon, and improve the electrical conductivity between the bit line 211 and the semiconductor pillar 22.

In some embodiments, the forming air gaps on sidewalls of the bit line 211 and forming the bit line in each of the plurality of bar grooves includes: forming a sacrificial layer on sidewalls of the plurality of the bar grooves; filling each of the plurality of bar is grooves with a metal material; and removing the sacrificial layer, and forming the air gaps. The air gaps can reduce the parasitic capacitance between the bit lines 211 and improve the electrical isolation effect between the bit line and the isolation structure, which is beneficial to improving the efficiency of the semiconductor device and reducing the energy consumption.

With reference to step S12 and FIG. 2C, a plurality of semiconductor pillars 22 arranged in a direction of the bit line are formed on a surface of each of the bit lines 211. The bit line 211 is electrically connected to the semiconductor pillar 22. In FIG. 2C, to clearly show the structure of the semiconductor device, a cross-section of only two semiconductor pillars 22 are schematically shown.

This embodiment provides a method for forming the semiconductor pillar 22. FIGS. 4A to 4B are schematic cross-sectional views of a process for forming a semiconductor pillar according to a specific implementation of the present disclosure.

With reference to FIG. 4A, an oxide semiconductor layer 220 is formed on the surfaces of the bit lines 211.

With reference to FIG. 4B, a protective layer 224 is formed on a surface of the oxide semiconductor layer 220. This step is optional and serves to protect the top of the semiconductor pillar 22 from being etched in the subsequent process.

With reference to FIG. 2C, the oxide semiconductor layer 220 and the protective layer 224 are patterned, to form the plurality of semiconductor pillars 22 arranged in the direction of the bit line, and a patterned protection structure 225 is disposed on a top surface of each of the plurality of semiconductor pillars 22. Optionally, in this embodiment, the protective layer 224 is also patterned.

In a specific implementation of the present disclosure, the semiconductor pillar 22 includes a first source-drain region 221 at a bottom, a channel region 222 in a middle, and a second source-drain region 223 at a top; the first source-drain region 221 and the second source-drain region 223 are formed through doping with a first-type dopant, and the channel region 222 is formed through doping with a second-type dopant; and the first source-drain region 221 is at least partially located below a lower surface of the gate structure layer 232, and if the first source-drain region 221 is all located below the lower is surface of the gate structure layer 232, an upper surface of the first source-drain region 221 is flush with the lower surface of the gate structure layer 232; and the second source-drain region 223 is at least partially located above an upper surface of the gate structure layer 232, and if the second source-drain region 223 is all located above the upper surface of the gate structure layer 232, a lower surface of the second source-drain region 223 is flush with the upper surface of the gate structure layer 232. The semiconductor pillars 22 and the GAA structure 23 form a vertical transistor.

The first source-drain region 221, the channel region 222, and the second source-drain region 223 are not substantially different structures, but for distinguishing the functions of different regions of the semiconductor pillars 22 in the semiconductor structure. That is, the vertical transistor is junctionless. The doping types of the first source-drain region 221, the channel region 222, and the second source-drain region 223 are the same, and the doping concentrations of the first source-drain region 221 and the second source-drain region 223 are larger than that of the channel region 222. As the integration level of a semiconductor device increases, its size is further reduced, such that the area of the source, drain, and channel regions is reduced. When the conventional PN junction transistor is formed, the difficulty of controlling the source and drain doping increases, and it is increasingly difficult to form a PN junction among the source, drain and channel regions. The vertical junctionless transistor can be manufactured by using the method of manufacturing a semiconductor structure in the present disclosure. The doping types of the source region, the drain region, and the channel region are the same, such that the PN junction is not formed, thereby avoiding the problems of threshold voltage drift and leakage current increase caused by doping mutation. In this case, junctionless transistors can suppress the short-channel effect and still operate at a scale of several nanometers, which can further improve the integration and performance of the 4F2 MRAM memory.

Further, the vertical junctionless transistor formed in this step is a GAA FET, which allows more sufficient depletion in the second region 212. And fewer short-channel effects are generated due to steeper SS and smaller DIBL.

With reference to step S13 and FIG. 2D, a GAA structure 23 is formed on a surface of the semiconductor pillar 22. The GAA structure 23 includes a first insulating layer 231, a gate structure layer 232, and a second insulating layer 233 that are sequentially disposed on a side surface of the semiconductor pillar 22.

This embodiment further provides a method of forming the GAA structure 23. FIGS. 5A to 5E are schematic cross-sectional views of a process for forming a GAA structure according to a specific implementation of the present disclosure; and With reference to FIG. 5A, a first insulating layer 231 is formed on the surfaces of the bit lines 211 and a surface of the isolation structure 212. The first insulating layer 231 surrounds bottoms of the semiconductor pillars 22. In other words, the first insulating layer 231 surrounds the first source-drain region 221 of each of the semiconductor pillars 22. The material of the first insulating layer 231 includes, but is not limited to, an oxide layer.

With reference to FIG. 5B, the gate dielectric layers 234 are formed, where each of the gate dielectric layers 234 covers an exposed part of one of the semiconductor pillars 22. In other words, the gate dielectric layer 234 covers the channel region 222 and the second source-drain region 223 of the semiconductor pillar 22.

With reference to FIG. 5C, a primary conductive layer 236 is formed on the surface of the first insulating layer 231 and the side surfaces of the gate dielectric layers 234. The material of the primary conductive layer 236 may be poly-silicon (poly), TiN, TaN, Al, W, Cu, or the like.

Figures 5D, 5E:
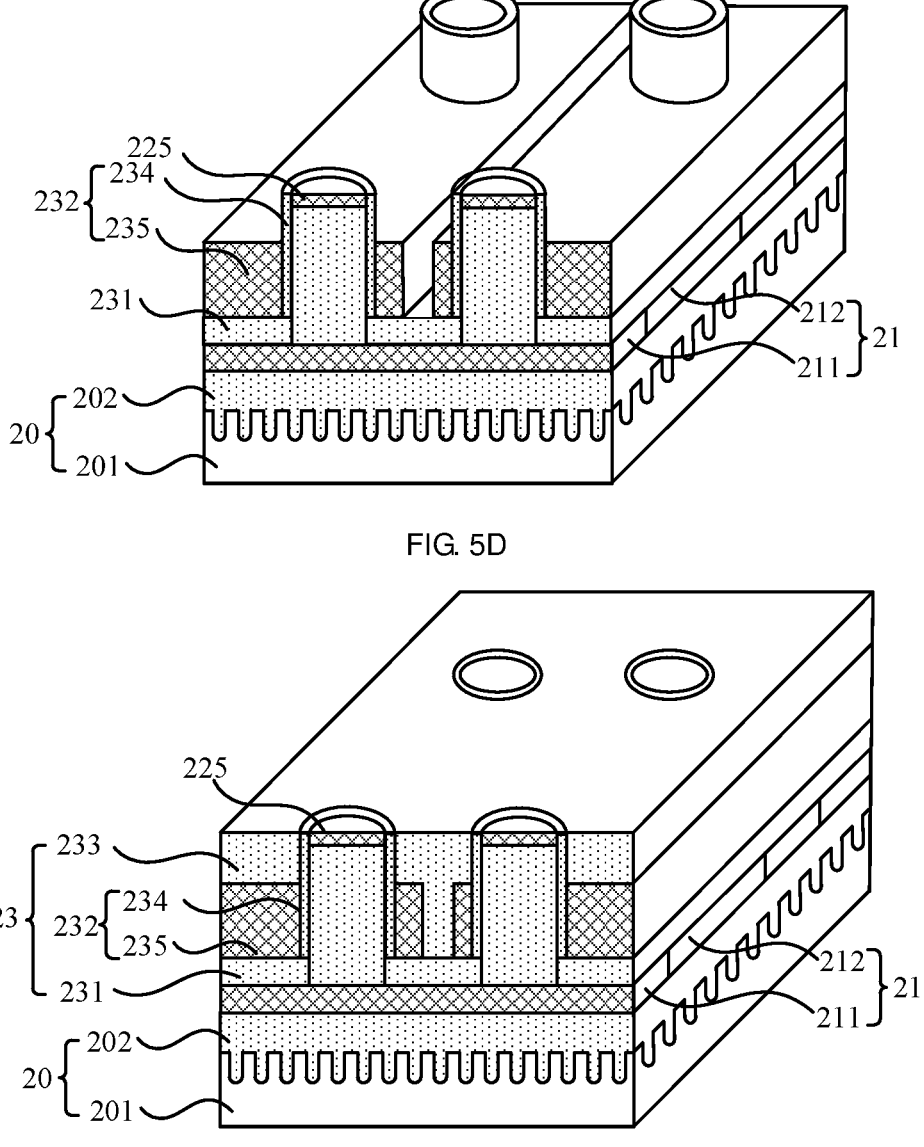

With reference to FIG. 5D, the primary conductive layer 236 is patterned, to form the plurality of gate conductive layers 235 extending along a direction perpendicular to the bit line. A gate conductive layer 235 is formed on a surface of the first insulating layer 231 and side surfaces of the gate dielectric layers 234. The gate dielectric layer 234 and the gate conductive layer 235 are taken as the gate structure layer 232. In other words, the gate structure layer 232 also extends along the vertical direction of the bit line.

With reference to FIG. 5E, a second insulating layer 233 is formed on a surface of the gate conductive layer 235. The second insulating layer 233 fills a gap between adjacent two of the semiconductor pillars 22. The second insulating layer 233 covers the exposed part of the gate dielectric layer 234.

With reference to FIG. 2D, after the GAA structure 23 is formed on the surface of the semiconductor pillar 22, the method includes: implanting metal ions into the semiconductor pillar, and forming a second metal silicide layer 226.

The second metal silicide layer 226 can reduce the contact resistance between the metal and the silicon, and improve the electrical conductivity between the semiconductor pillar 22 and the first wire 24. The second metal silicide layer 226 includes, but is not limited to, cobalt silicide, tantalum silicide, nickel silicide, titanium silicide, tungsten silicide, and the like.

In an embodiment, the forming of the second metal silicide layer includes: removing a patterned protection structure 225 on a top surface of the semiconductor pillar 22, which is an optional step; depositing a metal layer at a top of the semiconductor pillar 22; and performing high-temperature annealing on the metal layer, and the metal layer and the top of the semiconductor pillar forming the second metal silicide layer 226. In the high-temperature annealing process, the metal is in direct contact with the silicon layer in the semiconductor pillar and is converted into a metal silicide.

With reference to step S14 and FIG. 2E, a first wire 24, a magnetic tunnel junction 25, and a second wire 26 that are stacked sequentially above a surface of the GAA structure 23, where the first wire 24 is electrically connected to the semiconductor pillar 22.

Figures 6A, 6B:
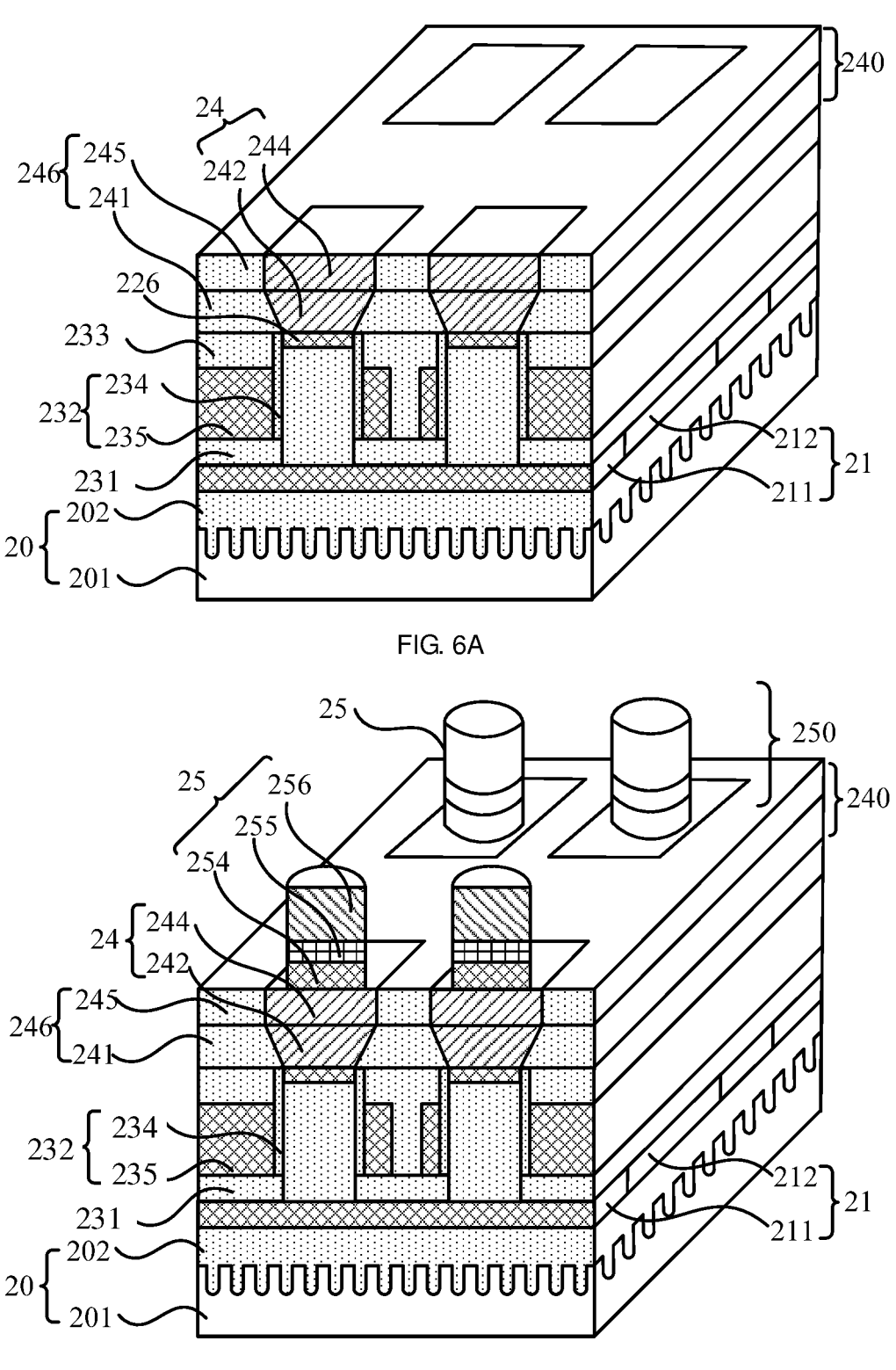
FIGS. 6A to 6B are schematic cross-sectional views of a main process during formation of a magnetic tunnel junction according to a specific implementation of the present dis- closure.

FIGS. 6A to 6B are schematic cross-sectional views of a main process during formation of a magnetic tunnel junction according to a specific implementation of the present disclosure. With reference to FIG. 6A, a first wire layer 240 is formed on the GAA structure, where the first wire layer 240 includes a plurality of first wires 24 independent of each other and a first spacer 246 disposed between adjacent first wires 24, and the first wire 24 is electrically connected to the semiconductor pillar 22.

With reference to FIG. 6B, a magnetic tunnel junction layer 250 is formed on the first wire layer 240, where the magnetic tunnel junction layer 250 includes a plurality of magnetic tunnel junctions 25 independent of each other, and the magnetic tunnel junction 25 is electrically connected to the first wire 24.

With reference to FIG. 2E, a second wire layer 260 is formed on the magnetic tunnel junction layer 250, where the second wire layer 260 includes a plurality of second wires 26 independent of each other, and a second spacer 266 disposed between adjacent the second wires 26, the second wire 26 is electrically connected to the magnetic tunnel junction 25, and the second spacer 266 fills gaps between adjacent magnetic tunnel junctions 25.

This embodiment further provides a method of forming the first wire layer 240. Such a method includes: Form a first spacing layer 241 on the GAA structure 23; Pattern the first spacing layer 241, and form a plurality of via holes, where the via hole exposes the top of the semiconductor pillar 22; Form a first contact structure 242 in each of the via holes; Form a first conductive layer 243 on the first spacing layer 241 and the first contact structures 242; Pattern the first conductive layer 243, and form a plurality of first sub-wires 244, where the first sub-wire 244 is electrically connected to the first contact structure 242, and the first sub-wire and the first contact structure are taken as the first wire 24; and form a second spacing layer 245, where the second spacing layer 245 fills a gap between adjacent two of the first sub-wires 244, and the first spacing layer 241 and the second spacing layer 245 are taken as the first spacer 246.

Further, in this embodiment, the first contact structure 242 is electrically connected to the second metal silicide layer 226 on the second source-drain regions 223 at the top of the semiconductor pillar 22. The first contact structure 242 is narrower than the first sub-wire 244. The first contact structure 242 serves as a connection pad to electrically connect the first sub-wire 244 to the second source-drain region 223 at the top of the semiconductor pillar 22.

This embodiment further provides a method for forming the magnetic tunnel junction layer 250. This method includes: forming a primary fixed layer 251 on the first wire layer 240; forming a primary non-magnetic insulating layer 252 on the primary fixed layer 251; forming a primary non-fixed layer 253 on the primary non-magnetic insulating layer 252, patterning the primary non-fixed layer 253, the primary non-magnetic insulating layer 252, and the primary fixed layer 251, and form the plurality of magnetic tunnel junctions 25 independent of each other, where the magnetic tunnel junction 25 includes a fixed layer 254, a non-magnetic insulating layer 255, and a non-fixed layer 256 that are disposed sequentially, a direction of magnetic moment of the non-fixed layer 256 is changeable, and a direction of magnetic moment of the fixed layer 254 is fixed. Based on the tunnel magneto-resistance effect, the resistance value between the fixed layer 254 and the non-fixed layer 256 changes with the switching of the magnetization polarity in the non-fixed layer 256, thereby performing the read and write operations of the magnetic tunnel junction unit.

This embodiment further provides a method for forming the second wire layer 260. The method includes: forming a third spacing layer 261, where the third spacing layer 261 fills a space between adjacent two of the magnetic tunnel junctions 25, and covers the magnetic tunnel junction layer 250; forming via holes penetrating through the third spacing layer 261, where the via hole exposes the magnetic tunnel junction 25; forming a second contact structure 262 in each of the via holes; forming a second conductive layer 263 on the third spacing layer 261 and the second contact structures 262; patterning the second conductive layer 263, and form a plurality of second sub-wires 264, where the second contact structure 262 is electrically connected to the second sub-wire 264, and the second contact structure and the second sub-wire are taken as the second wire 26; and forming a fourth spacing layer 265, where the fourth spacing layer 265 fills a gap between adjacent two of the second sub-wires 264, and the third spacing layer 261 and the fourth spacing layer 265 are taken as the second spacer 266.

Further, in this embodiment, the second contact structure 262 is electrically connected to the non-fixed layer 256 of the magnetic tunnel junction 25. The second contact structure 262 is narrower than the second sub-wire 264. The second contact structure 262 is used as a connection pad to electrically connect the second sub-wire 264 to the non-fixed layer 256 of the magnetic tunnel junction 25.

A semiconductor device composed of the vertical junctionless transistor and the magnetic tunnel junction unit can be formed by using the foregoing method, thereby avoiding the problems of threshold voltage drift and leakage current increase caused by doping mutation. In this case, junctionless transistors can suppress the short-channel effect and still operate at a scale of several nanometers, which can further improve the integration and performance of memory.

The present disclosure further provides a semiconductor structure. Refer to FIG. 2E. The semiconductor structure includes: a substrate 20; a plurality of bit lines 211 disposed on a surface of the substrate 20 and arranged in parallel; semiconductor pillars 22 disposed on surfaces of the bit lines 211 and arranged along a direction of the bit line, where the semiconductor pillar 22 is electrically connected to the bit line 211; a GAA structure 23, where the GAA structure 23 includes a first insulating layer 231, a gate structure layer 232, and a second insulating layer 233 that are sequentially disposed on a side surface of the semiconductor pillar 22; and a first wire 24, a magnetic tunnel junction 25, and a second wire 26 that are sequentially disposed above a surface of the GAA structure 23, where the first wire 24 is electrically connected to the semiconductor pillar 22.

Further, the semiconductor pillar 22 includes a first source-drain region 221 at a bottom, a channel region 222 in a middle, and a second source-drain region 223 at a top; the first source-drain region 221 and the second source-drain region 223 are formed through doping with a first-type dopant, and the channel region 222 is formed through doping with a second-type dopant; and the first source-drain region 221 is at least partially located below a lower surface of the gate structure layer 232, and if the first source-drain region 221 is all located below the lower surface of the gate structure layer 232, an upper surface of the first source-drain region 221 is flush with the lower surface of the gate structure layer 232; and the second source-drain region 223 is at least partially located above an upper surface of the gate structure layer 232, and if the second source-drain region 223 is all located above the upper surface of the gate structure layer 232, a lower surface of the second source-drain region 223 is flush with the upper surface of the gate structure layer 232. The gate structure layer 232 includes a gate conductive layer 235, and the lower surface of the gate structure layer 232 means a lower surface of the gate conductive layer 235, the upper surface of the gate structure layer 232 means an upper surface of the gate conductive layer 235.

The first source-drain region 221, the channel region 222, and the second source-drain region 223 are not substantially different structures, but for distinguishing the functions of different regions of the semiconductor pillars 22 in the semiconductor structure. That is, the vertical transistor is junctionless. The semiconductor structure in is the present disclosure includes the vertical junctionless transistor. The doping types of the source region, the drain region, and the channel region are the same, such that the PN junction is not formed, thereby avoiding the problems of threshold voltage drift and leakage current increase caused by doping mutation. In this case, junctionless transistors can suppress the short-channel effect and still operate at a scale of several nanometers, which can further improve the integration and performance of the 4F2 MRAM memory.

Further, the gate structure layer 232 includes: a gate dielectric layer 234 disposed on a side surface of the semiconductor pillar 22; a gate conductive layer 235 disposed between a first insulating layer 231 and a second insulating layer 233, covering a side surface of the gate dielectric layer 234, surrounding the side surface of the semiconductor pillar 22, and extending along a direction perpendicular to the bit line 211.

Further, the magnetic tunnel junction 25 includes a fixed layer 254, a non-magnetic insulating layer 255, and a non-fixed layer 256 that are disposed sequentially, a direction of magnetic moment of the non-fixed layer 256 is changeable, and a direction of magnetic moment of the fixed layer 254 is fixed. Based on the tunnel magneto-resistance effect, the resistance value between the fixed layer 254 and the non-fixed layer 256 changes with the switching of the magnetization polarity in the non-fixed layer 256, thereby performing the read and write operations of the magnetic tunnel junction unit.

In a specific implementation of the present disclosure, a first metal silicide layer (not shown in the figure) is formed on the surface of the bit line 211. Air gaps (not shown in the figure) are formed on the sidewalls of the bit line 211. A second metal silicide layer 226 is disposed at a top of the semiconductor pillar 22. The metal silicide layer can reduce the contact resistance between the metal and the silicon.

That is, the first metal silicide layer 214 can improve the electrical conductivity between the bit line 211 and the semiconductor pillar 22. The second metal silicide layer 226 can enhance the electrical conductivity between the semiconductor pillar 22 and the first wire 24.

The semiconductor structure provided by the embodiments of the present disclosure is formed by the vertical junctionless transistor and the magnetic tunnel junction unit, thereby avoiding the problems of threshold voltage drift and leakage current increase caused by doping mutation. In this case, junctionless transistors can suppress the short-channel effect and still operate at a scale of several nanometers, which can further improve the integration and performance of memory.

The present disclosure provides a semiconductor structure and a manufacturing method thereof. In the present disclosure, bit lines are buried in the substrate, and a vertical transistor and a magnetic tunnel junction region on the vertical transistor are formed, thereby improving the performance of the semiconductor structure and meeting the requirement of miniaturization.

Each specific implementation in this specification is described in a related manner, and the same and similar parts between the various specific implementations may be referred to each other, and each specific implementation focuses on the differences from other specific implementation. Particularly, because the specific implementations of the semiconductor structure are similar to those of the method of manufacturing a semiconductor structure, they are described in a relatively simple manner. For related matters, refer to some description of the specific implementations of the method of manufacturing a semiconductor structure.

The above described are merely preferable implementations of the present disclosure. It should be noted that some improvements and modifications may further be made by a person of ordinary skill in the art without departing from the principle of the present disclosure, and such improvements and modifications should also be deemed as falling within the protection scope of the present disclosure.

The invention claimed is:

1. A method of manufacturing a semiconductor structure, comprising:
   providing a substrate;
   forming a base pattern on the substrate, wherein the forming a base pattern on the substrate comprises:
   forming an isolation layer on a surface of the substrate;
   patterning the isolation layer, and forming an isolation structure, wherein the isolation structure comprises a plurality of bar grooves arranged in parallel; forming a bit line in each of the plurality of bar grooves; and forming a first metal silicide layer on the surface of the bit line, the base pattern comprises a plurality of bit lines arranged in parallel, and the isolation structure is disposed between adjacent two of the plurality of bit lines;
   forming a plurality of semiconductor pillars arranged in a direction of the bit line on a surface of each of the plurality of bit lines, wherein the bit line is electrically connected to the plurality of semiconductor pillars;
   forming a gate-all-around structure on a surface of each semiconductor pillar, wherein the gate-all-around structure comprises a first insulating layer, a gate structure layer, and a second insulating layer that are sequentially disposed on a side surface of each semiconductor pillar; and forming a first wire, a magnetic tunnel junction, and a second wire that are stacked sequentially above a surface of the gate-all-around structure, wherein the first wire is electrically connected to the semiconductor pillar.

2. The method of manufacturing a semiconductor structure according to claim 1, wherein
   the semiconductor pillar comprises a first source-drain region at a bottom, a channel region in a middle, and a second source-drain region at a top;
   the first source-drain region and the second source-drain region are formed through doping with a first-type dopant, and the channel region is formed through doping with a second-type dopant; and
   the first source-drain region is at least partially located below a lower surface of the gate structure layer, and when the first source-drain region is all located below the lower surface of the gate structure layer, an upper surface of the first source-drain region is flush with the lower surface of the gate structure layer; and the second source-drain region is at least partially located above an upper surface of the gate structure layer, and when the second source-drain region is all located above the upper surface of the gate structure layer, a lower surface of the second source-drain region is flush with the upper surface of the gate structure layer.

3. The method of manufacturing a semiconductor structure according to claim 1, wherein
   the forming a plurality of semiconductor pillars arranged in a direction of the bit line on a surface of each of the plurality of bit lines comprises:
   forming a silicon-based semiconductor layer on surfaces of the plurality of bit lines;
   forming a protective layer on a surface of the silicon-based semiconductor layer; and
   patterning the silicon-based semiconductor layer and the protective layer, to form the plurality of semiconductor pillars in the direction of the bit line, wherein a top surface of each of the plurality of semiconductor pillars is provided with a patterned protection structure.

4. The method of manufacturing a semiconductor structure according to claim 1, wherein
   air gaps are formed on sidewalls of the bit line, and the forming the bit line in each of the plurality of bar grooves comprises:
   forming a sacrificial layer on sidewalls of the plurality of bar grooves;
   filling each of the plurality of bar grooves with a metal material; and
   removing the sacrificial layer, and forming the air gaps.

5. The method of manufacturing a semiconductor structure according to claim 1, wherein
   the forming a gate-all-around structure on a surface of the semiconductor pillar comprises:
   forming the first insulating layer on surfaces of the plurality of bit lines and a surface of the isolation structure, wherein the first insulating layer surrounds bottoms of the semiconductor pillars;
   forming gate dielectric layers, wherein each of the gate dielectric layers covers an exposed part of one of the semiconductor pillars;
   forming a gate conductive layer on a surface of the first insulating layer and side surfaces of the gate dielectric layers, wherein the gate dielectric layer and the gate conductive layer are taken as the gate structure layer; and forming the second insulating layer on a surface of the gate conductive layer, wherein the second insulating layer fills a gap between adjacent two of the plurality of semiconductor pillars.

6. The method of manufacturing a semiconductor structure according to claim 5, wherein the forming a gate conductive layer on a surface of the first insulating layer and side surfaces of the gate dielectric layers comprises:

forming a primary conductive layer on the surface of the first insulating layer and the side surfaces of the gate dielectric layers; and patterning the primary conductive layer, and forming a plurality of gate conductive layers extending along a direction perpendicular to the bit line.

7. The method of manufacturing a semiconductor structure according to claim 5, after the forming a gate-all-around structure on a surface of the semiconductor pillar, further comprises:

implanting metal ions into the semiconductor pillar, and forming a second metal silicide layer.

8. The method of manufacturing a semiconductor structure according to claim 7, wherein the forming a second metal silicide layer comprises:

removing a patterned protection structure on a top of each semiconductor pillar;

depositing a metal layer at the top of each semiconductor pillar; and performing high-temperature annealing on the metal layer, and the metal layer and the top of the semiconductor pillar forming the second metal silicide layer.

9. The method of manufacturing a semiconductor structure according to claim 1, wherein the forming a magnetic tunnel junction above a surface of the gate-all-around structure comprises:

forming a first wire layer on the gate-all-around structure, wherein the first wire layer comprises a plurality of first wires independent of each other and a first spacer disposed between adjacent first wires, and each first wire is electrically connected to each semiconductor pillar;

forming a magnetic tunnel junction layer on the first wire layer, wherein the magnetic tunnel junction layer comprises a plurality of magnetic tunnel junctions independent of each other, and each magnetic tunnel junction is electrically connected to each first wire; and forming a second wire layer on the magnetic tunnel junction layer, wherein the second wire layer comprises a plurality of second wires independent of each other, and a second spacer disposed between adjacent second wires, each second wire is electrically connected to each magnetic tunnel junction, and the second spacer fills gaps between adjacent magnetic tunnel junctions.

10. The method of manufacturing a semiconductor structure according to claim 9, wherein the forming a first wire layer on the gate-all-around structure comprises:

forming a first spacing layer on the gate-all-around structure;

patterning the first spacing layer, and forming a plurality of via holes, wherein each via hole exposes a top of the semiconductor pillar;

forming a first contact structure in each of the plurality of via holes;

forming a first conductive layer on the first spacing layer and a plurality of first contact structures;

patterning the first conductive layer, and forming a plurality of first sub-wires, wherein each first sub-wire is electrically connected to each first contact structure, and the first sub-wire and the first contact structure are taken as the first wire; and forming a second spacing layer, wherein the second spacing layer fills a gap between adjacent two of the plurality of first sub-wires, and the first spacing layer and the second spacing layer are taken as the first spacer.

11. The method of manufacturing a semiconductor structure according to claim 9, wherein the forming a magnetic tunnel junction layer on the first wire layer comprises:

forming a primary fixed layer on the first wire layer;

forming a primary non-magnetic insulating layer on the primary fixed layer;

forming a primary non-fixed layer on the primary non-magnetic insulating layer; and patterning the primary non-fixed layer, the primary non-magnetic insulating layer, and the primary fixed layer, and forming the plurality of magnetic tunnel junctions independent of each other, wherein the magnetic tunnel junction comprises a fixed layer, a non-magnetic insulating layer, and a non-fixed layer that are disposed sequentially, a direction of magnetic moment of the non-fixed layer is changeable, and a direction of magnetic moment of the fixed layer is fixed.

12. The method of manufacturing a semiconductor structure according to claim 9, wherein the forming a second wire layer on the magnetic tunnel junction layer comprises:

forming a third spacing layer, wherein the third spacing layer fills a space between adjacent two of the plurality of magnetic tunnel junctions, and covers the magnetic tunnel junction layer;

forming via holes penetrating through the third spacing layer, wherein each via hole exposes the magnetic tunnel junction;

forming a second contact structure in each of the plurality of via holes;

forming a second conductive layer on the third spacing layer and the second contact structures;

patterning the second conductive layer, and forming a plurality of second sub-wires, wherein the second contact structure is electrically connected to the second sub-wire, and the second contact structure and the second sub-wire are taken as the second wire; and forming a fourth spacing layer, wherein the fourth spacing layer fills a gap between adjacent two of the plurality of second sub-wires, and the third spacing layer and the fourth spacing layer are taken as the second spacer.

* * * * *